(12) United States Patent
Kuo

(10) Patent No.: US 11,841,593 B2
(45) Date of Patent: *Dec. 12, 2023

(54) TRANSPARENT DISPLAY DEVICE

(71) Applicant: InnoLux Corporation, Miao-Li County (TW)

(72) Inventor: Shu-Ming Kuo, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/988,727

(22) Filed: Nov. 16, 2022

(65) Prior Publication Data
US 2023/0076337 A1 Mar. 9, 2023

Related U.S. Application Data

(63) Continuation of application No. 17/157,893, filed on Jan. 25, 2021, now Pat. No. 11,537,015.

(60) Provisional application No. 62/978,311, filed on Feb. 19, 2020.

(30) Foreign Application Priority Data

Nov. 4, 2020 (CN) .......................... 202011217616.6

(51) Int. Cl.
G02F 1/1335 (2006.01)
G02F 1/1362 (2006.01)
G02F 1/1343 (2006.01)

(52) U.S. Cl.
CPC .. *G02F 1/136209* (2013.01); *G02F 1/133514* (2013.01); *G02F 1/134309* (2013.01); *G02F 1/136286* (2013.01)

(58) Field of Classification Search
CPC ......... G02F 1/136209; G02F 1/133514; G02F 1/134309; G02F 1/136286
See application file for complete search history.

(56) References Cited

U.S. PATENT DOCUMENTS

| | | | | |
|---|---|---|---|---|
| 11,537,015 B2* | 12/2022 | Kuo | ...................... | G02B 5/003 |
| 2007/0285600 A1* | 12/2007 | Yeo | ................... | G02F 1/133512 |
| | | | | 349/110 |
| 2008/0218669 A1* | 9/2008 | Nishimura | ........ | G02F 1/133512 |
| | | | | 349/110 |
| 2016/0116808 A1* | 4/2016 | Higano | ............. | G02F 1/133512 |
| | | | | 349/110 |
| 2016/0197131 A1* | 7/2016 | Park | .................... | H10K 50/8426 |
| | | | | 438/23 |
| 2019/0137815 A1* | 5/2019 | Kim | .................. | G02F 1/133514 |
| 2019/0155106 A1* | 5/2019 | Lee | ................... | G02F 1/133514 |
| 2020/0133053 A1* | 4/2020 | Yang | ................. | G02F 1/133514 |

* cited by examiner

Primary Examiner — James A Dudek
(74) Attorney, Agent, or Firm — Winston Hsu

(57) ABSTRACT

The present disclosure provides a transparent display device including a first substrate and a second substrate, and the second substrate is opposite to the first substrate. The light blocking element is disposed between the first substrate and the second substrate, and the light blocking element has a light transmitting opening. The light blocking element further has another light transmitting opening, and the another light transmitting opening and the light transmitting opening have different areas.

11 Claims, 8 Drawing Sheets

TRANSPARENT DISPLAY DEVICE

CROSS REFERENCE TO RELATED APPLICATIONS

This application is a continuation application of U.S. application Ser. No. 17/157,893, filed on Jan. 25, 2021, which claims the benefit of U.S. Provisional Application No. 62/978,311, filed on Feb. 19, 2020. The contents of these applications are incorporated herein by reference.

BACKGROUND OF THE DISCLOSURE

1. Field of the Disclosure

The present disclosure relates to an electronic device, and more particularly to an electronic device with a transparent display state and an image display function.

2. Description of the Prior Art

The transparent display devices are a kind of display with both a transparent display state and an image display function, so that a user located in front of the transparent display device may not only view the image, but also view objects in the background behind it. The transparent display devices generally may be applied to billboards, display windows, vehicle windshield, etc. However, the transparent display device needs to adjust brightness of images when displaying the images, and may increase energy consumption or discomfort to the user.

SUMMARY OF THE DISCLOSURE

An embodiment of the present disclosure provides a transparent display device. The transparent display device includes a first substrate and a second substrate, and the second substrate is opposite to the first substrate. The light blocking element is disposed between the first substrate and the second substrate, and the light blocking element has a light transmitting opening. The light blocking element further has another light transmitting opening, and the another light transmitting opening and the light transmitting opening have different areas.

These and other objectives of the present disclosure will no doubt become obvious to those of ordinary skill in the art after reading the following detailed description of the embodiment that is illustrated in the various figures and drawings.

DETAILED DESCRIPTION

Figure 1:
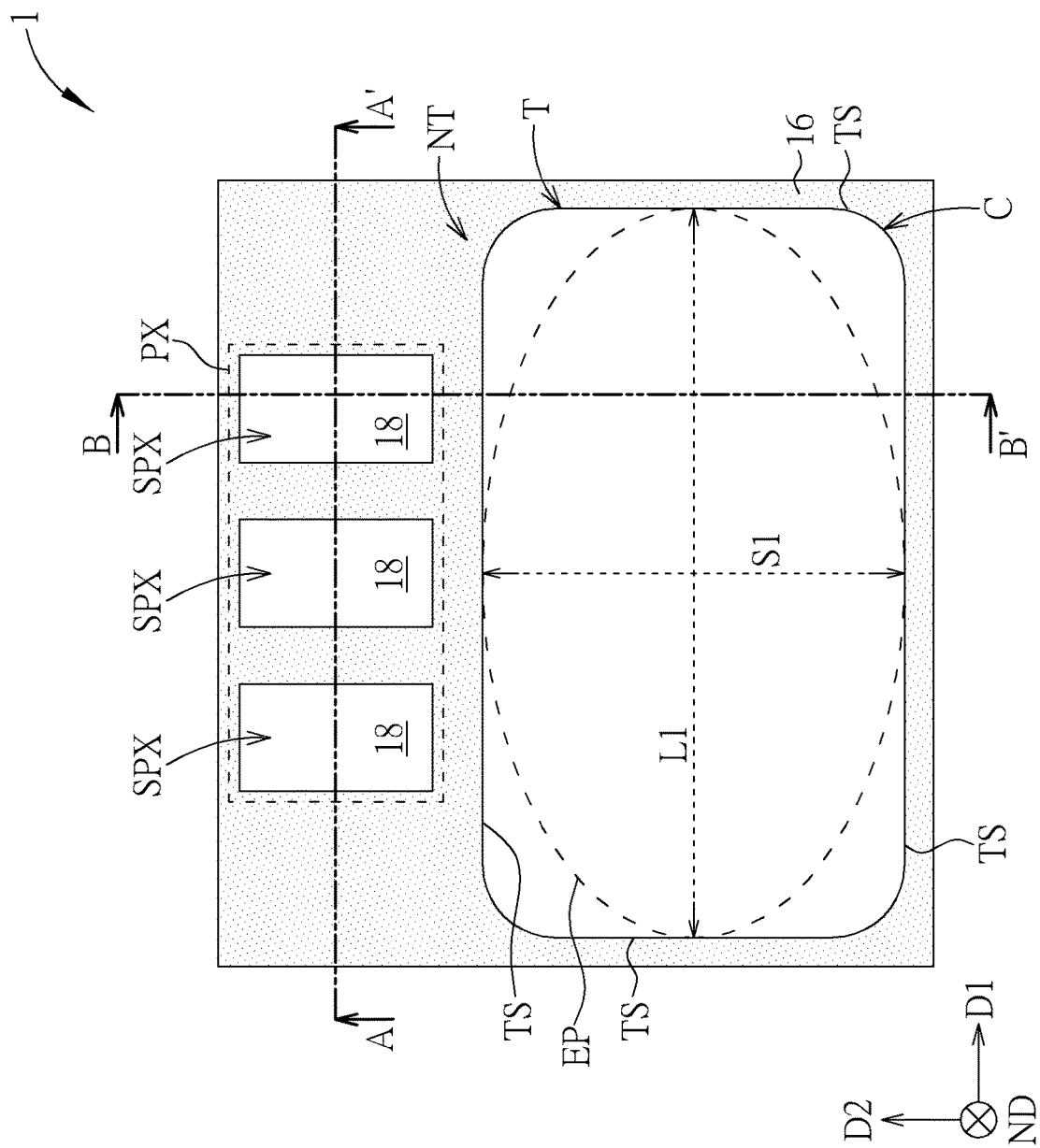
FIG. 1 schematically illustrates a top view of an electronic device according to a first embodiment of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and dimensions of the elements in the drawings are just illustrative, and are not intended to limit the scope of the present disclosure.

Certain terms are used throughout the specification and the appended claims of the present disclosure to refer to specific elements. Those skilled in the art should understand that electronic equipment manufacturers may refer to an element by different names, and this document does not intend to distinguish between elements that differ in name but not function. In the following description and claims, the terms "comprise", "include" and "have" are open-ended fashion, so they should be interpreted as "including but not limited to . . . ".

Spatially relative terms, such as "above", "on", "beneath", "below", "under", "left", "right", "before", "front", "after", "behind" and the like, used in the following embodiments just refer to the directions in the drawings and are not intended to limit the present disclosure. It should be understood that the elements in the drawings may be disposed in any kind of formation known by one skilled in the related art to describe the elements in a certain way. Furthermore, when one element or one layer is called "on" another element or another layer, or called "connected to" another element or another layer, it may be understood that the one element or the one layer is "directly on" the another element or the another layer, or "directly connected to" the another element or the another layer, or another element or another layer may be sandwiched between the one element and the another element or between the one layer and the another layer (indirectly). On the contrary, when the one element or the one layer is called "directly on" or "directly connected to" the another element or the another layer, it may be understood that there is no other elements or layers sandwiched between the one element and the another element or between the one layer and the another layer.

When ordinal numbers, such as "first" and "second", used in the specification and claims are used to modify elements in the claims, they do not mean and represent that the claimed elements have any previous ordinal numbers, nor do they represent the order of a claimed element and another claimed element, or the order of manufacturing methods. These ordinal numbers are just used to distinguish a claimed element with a certain name from another claimed element with the same name.

In the present disclosure, the lengths and widths may be measured by optical microscope, in which the thicknesses may be measured from cross-sectional image obtained by electron microscope, but the present disclosure is not limited to this. In addition, any two values or directions used for comparison may have certain errors.

In this document, the terms "about", "substantially" and "approximately" usually mean within 10%, 5%, 3%, 2%, 1% or 0.5% of a given value or range. The quantity given here is about the quantity, that is, without specifying "about", "substantially" and "approximately", the meanings of "about", "substantially" and "approximately" may still be implied. In addition, the term "range from a first value to a second value" and the term "between a first value and a second value" means that the range includes the first value, the second value and other values between them.

It should be understood that according to the following embodiments, features of different embodiments may be replaced, recombined or mixed to constitute other embodiments without departing from the spirit of the present disclosure.

The electronic device disclosed in the present disclosure may include a display device, an antenna device, a light emitting device, a sensing device, or a tiled device, but is not limited thereto. The electronic device may include a bendable or flexible electronic device. The antenna device may be, for example, a liquid crystal antenna, but is not limited to this. The tiled device may be, for example, a display tiled device or an antenna tiled device, but is not limited to this. It should be noted that the electronic device may be any combination of the foregoing, but is not limited thereto. The electronic device may include a self-luminous display device or a non-self-luminous display device. The electronic device may include, for example, a liquid crystal layer, fluorescence, phosphor, light emitting diodes, other suitable display media, or a combination of the foregoing, but not limited thereto. Light emitting diodes may include, for example, organic light emitting diodes (OLED), sub-millimeter light emitting diodes (mini LED), micro LEDs, quantum dot LEDs (quantum dot LEDs, which may include QLEDs, QDLEDs) or other suitable elements, or combinations of the above, but not limited thereto. Hereinafter, a light emitting diode display device may be used as an electronic device to illustrate the content of the present disclosure, but the present disclosure is not limited to this.

Figure 2:
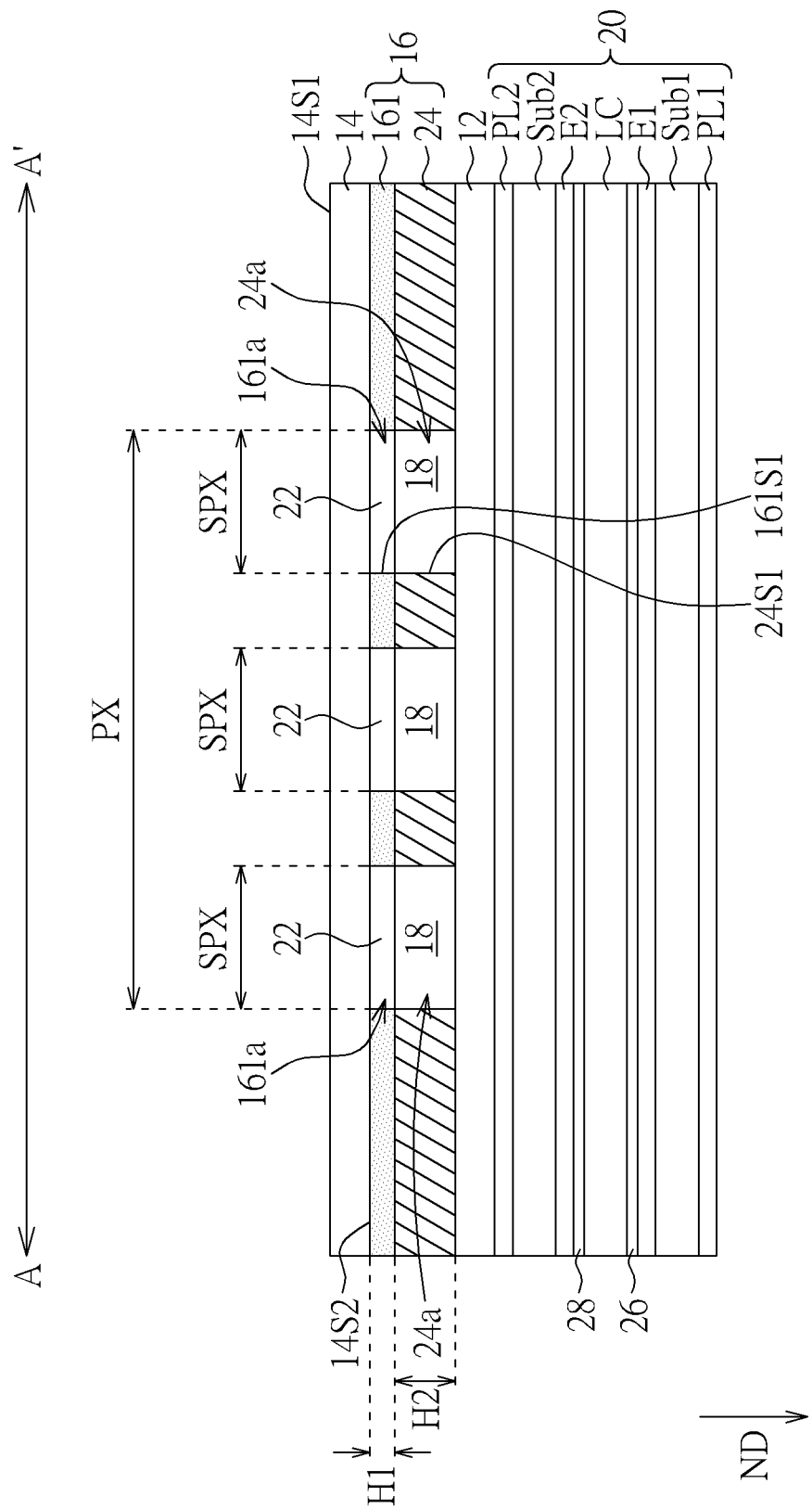
FIG. 2 schematically illustrates a cross-sectional view along a cross-sectional line A-A' of FIG. 1.
Figure 3:
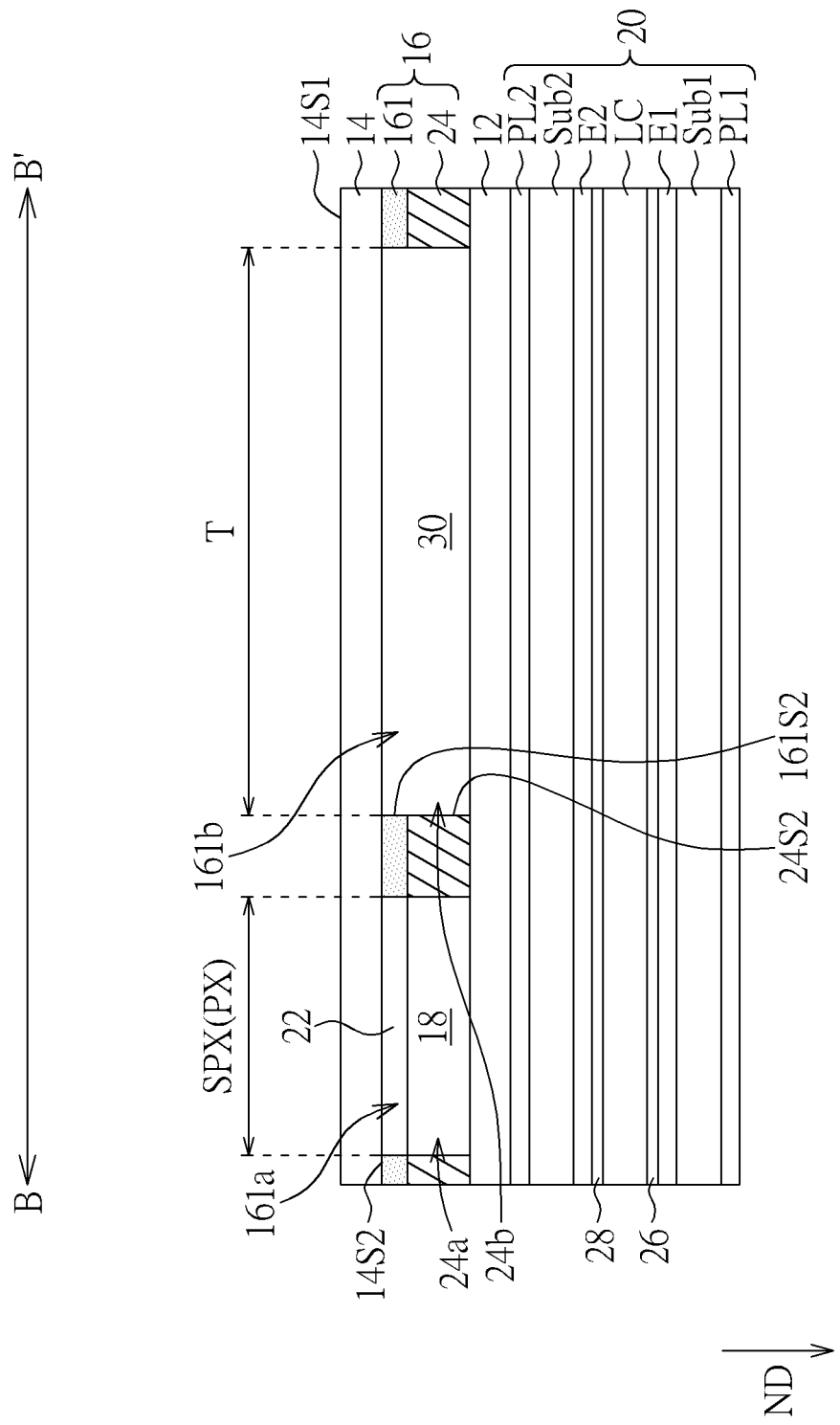
FIG. 3 schematically illustrates a cross-sectional view along a cross-sectional line B-B' of FIG. 1.

FIG. 1 schematically illustrates a top view of an electronic device according to a first embodiment of the present disclosure, FIG. 2 schematically illustrates a cross-sectional view along a cross-sectional line A-A' of FIG. 1, and FIG. 3 schematically illustrates a cross-sectional view along a cross-sectional line B-B' of FIG. 1. As shown in FIG. 1, the electronic device 1 may have pixel regions PX, a light blocking region NT, and a light transmitting opening T. The light blocking region NT does not generate light or allow light to penetrate through, and the light blocking region NT may separate the pixel regions PX from each other and divide the pixel regions PX from the light transmitting opening T. In order to clearly illustrate the electronic device 1, FIG. 1 shows a single pixel region PX and a single light transmitting opening T of the electronic device 1, but the present disclosure is not limited thereto. In some embodiments, the electronic device 1 may have a plurality of pixel regions PX and a plurality of light transmitting openings T. As shown in FIG. 1, the pixel region PX may include a plurality of sub-pixel regions SPX. Parts of the electronic device 1 located in the sub-pixel regions SPX may generate light of different colors so as to show colorful images. In detail, when the electronic device 1 is a self-luminous display device, the light blocking region NT may separate the sub-pixel regions SPX from each other to improve light mixing, thereby improving display quality. A part of the electronic device 1 corresponding to the light transmitting opening T may allow light to penetrate through, so that a user may view background image from the front of the electronic device 1, but light penetrating through the light transmitting opening T does not participate in image display of the electronic device 1.

Figure 6:
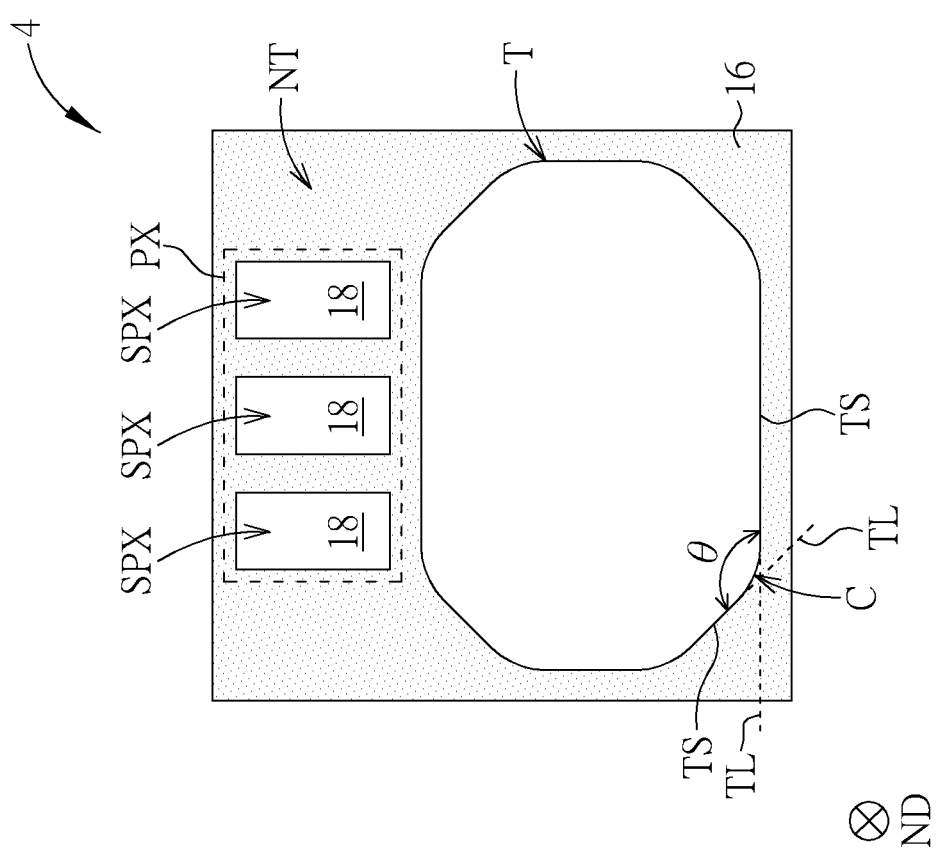
FIG. 6 schematically illustrates a top view of an electronic device according to a fourth embodiment of the present disclosure.

It should be noted that, as shown in FIG. 1, the light transmitting opening T may have at least four sides TS, and at least two adjacent sides TS may form at least one round corner C, in other words, the light transmitting opening T may not have sharp corners. In this way, diffraction occurring when light penetrates through the light transmitting opening T may be reduced. As the number of side edges TS increases, an angle between adjacent side edges TS may be increased, thereby reducing the degree of the diffraction. For example, as shown in FIG. 6, a top-view shape of the light transmitting opening T may be, for example, an octagonal shape, and the round corner C formed by the adjacent two sides TS may be, for example, an obtuse angle, but not limited thereto.

As shown in FIG. 1, the light transmitting opening T may have a major axis L1 and a minor axis S1 in a top view direction (parallel to a normal direction ND of the first substrate 12), wherein the major axis L1 is a maximum length of the light transmitting opening T along a first direction D1, and the minor axis S1 is a maximum length of the light transmitting opening T along a second direction D2. The first direction D1 is different from the second direction D2, and the top view direction may be, for example, the normal direction ND of the first substrate 12, in which the first direction D1 and the second direction D2 are perpendicular to the top view direction. The first direction D1 and the second direction D2 may be for example perpendicular to each other. In detail, the major axis L1 and the minor axis S1 of the light transmitting opening T may form a largest inscribed ellipse EP, for example. In the embodiment of FIG. 1, the ratio of the major axis L1 to the minor axis S1 may be greater than 1 and less than 1.5, so as to reduce the slit interference effect when light penetrates through the light transmitting opening T, thereby reducing the degree of the diffraction. In some embodiments, the major axis L1 and the minor axis S1 may be greater than a half of a wavelength of the light, for example, greater than a few hundred nanometers. In some embodiments, the largest inscribed ellipse EP of the light transmitting opening T may be replaced with a smallest circumscribed ellipse, but it is not limited to this.

Specifically, as shown in FIG. 2 and FIG. 3, the electronic device 1 may include a first substrate 12, a second substrate 14, a light blocking element 16, a plurality of display elements 18, and a transmittance controlling element 20. The second substrate 14 may be opposite to the first substrate 12, and the light blocking element 16 and the display elements 18 are disposed between the first substrate 12 and the second substrate 14. In the embodiment of FIG. 2, the electronic device 1 displays images from an upper surface 14S1 of the second substrate 14 away from the first substrate 12. The second substrate 14 may be for example a transparent substrate, and the first substrate 12 may for example include a transparent substrate and an array circuit for controlling the display elements 18, but the present disclosure is not limited thereto. The transparent substrate may include, for example, a rigid substrate or a flexible substrate. The material of the transparent substrate may include, for example, glass, ceramic, quartz, sapphire, acrylic, polyimide (PI), polyethylene terephthalate (PET), polycarbonate (PC), polyethersulfone (PES), polybutylene terephthalate (PBT), polyethylene naphthalate (PEN), polyarylate (PAR), other suitable materials or a combination of the above, but not limited thereto.

In the embodiment of FIG. 2 and FIG. 3, the light blocking element 16 may include a light blocking layer 161 and a partition wall 24, wherein the light blocking layer 161 is disposed on a lower surface 14S2 of the second substrate 14 facing the first substrate 12, in other words, the light blocking layer 161 is disposed between the second substrate 14 and the first substrate 12, and the partition wall 24 is disposed between the light blocking layer 161 and the first substrate 12. The light blocking layer 161 may have a plurality of first display openings 161a and a first opening 161b, and the partition wall 24 may have a plurality of second display openings 24a and a second opening 24b. The second display openings 24a may correspond to the first display openings 161a and may be located in the corresponding pixel regions PX, respectively, and the plurality of display elements 18 may be disposed in the second display openings 24a, respectively. In details, the plurality of second display openings 24a may correspond to the plurality of first display openings 161a and may be located in the corresponding pixel regions PX, respectively. Basically, the plurality of display elements 18 may be disposed in the plurality of second display openings 24a respectively means that at least one of the plurality of display elements 18 may be disposed in one of the plurality of second display openings 24a, but not limited thereto. For example, one of the plurality of display elements 18 may be disposed in one of the plurality of second display openings 24a, or two or more of the plurality of display elements 18 may be disposed in one of the plurality of second display openings 24a. The second opening 24b may correspond to the first opening 161b. The light blocking layer 161 and the partition wall 24 have light blocking property. In the present embodiment, one of the first display openings 161a and the corresponding second display opening 24a may be used to define the corresponding sub-pixel region SPX, and the first opening 161b and the second opening 24b may be used to define the light transmitting opening T, but not limited thereto. In some embodiments, the electronic device may have a plurality of the light transmitting openings T. The light blocking layer 161 may have a plurality of the first openings 161b, the partition wall 24 may have a plurality of second openings 24b, and at least one of the plurality of first openings 161b and at least one of the plurality of second openings 24b may be used to define at least one of the plurality of light transmitting openings T, but not limited thereto. For example, an edge of one of the sub-pixel regions SPX viewed from the normal direction ND of the first substrate 12 may be defined by a side 161S1 of the corresponding first display opening 161a and/or a side 24S1 of the corresponding second display opening 24a closer to a center of the corresponding first display opening 161a in the normal direction ND of the first substrate 12, and one of the sides TS of the light transmitting opening T (as shown in FIG. 1) may be defined by a side 161S2 of the first opening 161b and/or a side 24S2 of the second opening 24a that is closer to a center of the first opening 161b in the normal direction ND of the first substrate 12. The light blocking layer 161 may be black, for example, and may include a photoresist material, an ink material, or other suitable materials, for example. The material of the partition wall 24 may include, for example, a photoresist material, an ink material, or other suitable materials. In some embodiments, when the partition wall 24 includes a black photoresist material or a black ink material, the electronic device 1 may not need the light blocking layer 161. In this case, the second display openings 24a may respectively be used to define the sub-pixel regions SPX, and the second opening 24b may be used to define the light transmitting opening T, but not limited thereto. In the embodiment of FIG. 2, the display elements 18 take light emitting diodes as an example for illustration, but are not limited thereto. The light emitting diodes may include organic light emitting diodes, sub-millimeter light emitting diodes, micro-light emitting diodes, quantum dot light emitting diodes, or other suitable elements, or a combination of the above, but not limited thereto. The display elements 18 may be respectively disposed in the corresponding sub-pixel regions SPX, and the display elements 18 in the same pixel region PX may be used to generate light of different colors, for example, blue light, green light, or red light, but not limited thereto.

In some embodiments, the electronic device 1 may optionally include a plurality of color filter layers 22 respectively disposed in the corresponding first display openings 161a, and each color filter layer 22 may be disposed between the corresponding display element 18 and the second substrate 14. In details, the plurality of color filter layers 22 may respectively and fully disposed in the corresponding first display openings 161a, or at least a portion of the plurality of color filter layers 22 may respectively disposed in the corresponding first display openings 161a, but is not limited thereto. The color filter layers 22 in the same pixel region PX may have different colors, such that light generated from the display elements 18 may have desired colors after penetrating through the color filter layers 22, but is not limited thereto. The materials of the color filter layers 22 may include, for example, photoresist materials or ink materials, but are not limited thereto. It is worthily noted that, in the embodiment of FIG. 2, since the light emitting diode itself is easier to reflect light, by means of installing the color filter layers 22 on the display elements 18, the reflected light with undesirable colors reflected by the display elements 18 and viewed by the user may be reduced. Accordingly, contrast of images may be improved, thereby improving display quality. In some embodiments, the color filter layers 22 may also be replaced with light conversion layers that are used to convert colors of light of the display elements 18 into other colors. The light conversion layers may, for example, include fluorescence, phosphor, quantum dots or pigments, but the present disclosure is not limited to this. In such case, the display elements 18 may, for example, generate the same or different colors of light. In some embodiments, the display element 18 may also include a liquid crystal layer, fluorescence, phosphor, other suitable display media, or a combination of the foregoing, but not limited thereto. When the display elements 18 include the liquid crystal layer, the electronic device 1 may further optionally include a backlight module disposed on a side of the first substrate 12 away from the second substrate 14, but not limited thereto.

As shown in FIG. 2 and FIG. 3, a thickness H1 (for example a maximum thickness) of the partition wall 24 in the normal direction ND is larger than a thickness H2 (for example a maximum thickness) of the light blocking layer 161 in the normal direction ND. In detail, when viewed along the normal direction ND of the first substrate 12, the partition wall 24 may surround the display elements 18. When the thickness H1 (for example a maximum thickness) of the partition wall 24 in the normal direction ND is greater than the thickness H2 (for example a maximum thickness) of the light blocking layer 161 in the normal direction ND, light from the display elements 18 may be blocked from laterally mixing and/or be blocked from entering the light transmitting opening T, so as to reduce the problem of lateral light leakage. The material of the partition wall 24 may include a photoresist material, an ink material or other suitable materials. The partition wall 24 may for example be designed to be a single-layered or multilayered stack according to product requirements. The partition wall 24 may include, for example, a white material, a black material, a gray material, or a combination of at least two of the above. The color of the partition wall 24 may be determined by the combination of the colors of the materials in the partition wall 24. For example, when a color of one layer of the partition wall 24 has a higher transmittance, the partition wall 24 may further include another layer with a color of a lower transmittance. For example, the partition wall 24 may include a stack of a layer of the black material and a layer of the white material, but is not limited thereto.

As shown in FIG. 3, the light transmitting opening T may at least partially overlap the transmittance controlling element 20 in the normal direction ND of the first substrate 12, or the light transmitting opening T exposes a portion of the transmittance controlling element 20. Specifically, the first opening 161b and the second opening 24b may at least partially overlap the transmittance controlling element 20 in the normal direction ND of the first substrate 12, such that brightness of light after penetrating through the light transmitting opening T may be adjusted, but not limited thereto. The term "at least partially overlap" or "overlap" or "partially overlap" mentioned in the present disclosure may for example refer to one element completely overlapping another element or a part of one element overlapping another part of another element. In the embodiment of FIG. 3, the transmittance controlling element 20 may be disposed on a lower surface of the first substrate 12 away from the second substrate 14, in other words, the first substrate 12 may be disposed between the transmittance controlling element 20 and the second substrate 14. In some embodiments, the transmittance controlling element 20 may extend to the lower surface of the first substrate 12 in the sub-pixel regions SPX or cover the lower surface of the first substrate 12 away from the second substrate 14; that is, in the normal direction ND of the first substrate 12, the sub-pixel regions SPX may overlap the transmittance controlling element 20, or the whole first substrate 12 overlaps the transmittance controlling element 20. In one embodiment, the transmittance controlling element 20 may include a first polarizer PL1, a second polarizer PL2, a first electrode layer E1, a second electrode layer E2, and a liquid crystal layer LC. The liquid crystal layer LC is disposed between the first electrode layer E1 and the second electrode layer E2, the first electrode layer E1 is disposed between the liquid crystal layer LC and the first polarizer PL1, and the second electrode layer E2 is disposed between the liquid crystal layer LC and the second polarizer PL2. The first electrode layer E1 and the second electrode layer E2 may, for example, include transparent conductive materials, such that light may penetrate through the first electrode layer E1 and the second electrode layer E2, but not limited thereto. The liquid crystal layer LC may include, for example, nematic liquid crystal material, cholesteric liquid crystal (CLC) material, polymer-dispersed liquid crystal (PDLC) material, polymer network liquid crystal (PNLC) material or other suitable types of liquid crystal materials. In some embodiments, the liquid crystal layer LC may further optionally include a dye for adjusting transmittance of the liquid crystal layer LC. For example, the liquid crystal layer LC may include cholesterol liquid crystal material and a dye, but is not limited thereto. By means of controlling a voltage difference between the first electrode layer E1 and the second electrode layer E2, orientation of liquid crystal molecules in the liquid crystal layer LC may be adjusted, thereby altering the transmittance of the transmittance controlling element 20. Based on different materials of the liquid crystal layer LC, the method for reducing the transmittance of the transmittance controlling element 20 may use a blocking method or a hazing method, but not limited to this. The first electrode layer E1 may, for example, be a pattern layer including a plurality of electrodes for separately controlling the transmittances of parts of the electronic device 1 corresponding to different light transmitting openings T, or be an electrode layer covering a whole surface of the first substrate 12. The first polarizer PL1 and the second polarizer PL2 may be, for example, both linear polarizers or respectively a linear polarizer and a circular polarizer, but are not limited thereto. The circular polarizer may include, for example, a linear polarizer and a quarter-wave retarder sequentially disposed on the electrode layer E2, but not limited thereto. When the second polarizer PL2 is a circular polarizer, light penetrating through the transmittance controlling element 20 may have circular polarization, such that the user wearing glasses with linear polarizers is prevented from being unable to see the light penetrating through the light transmission opening T, thereby allowing the user to see the background image.

As shown in FIG. 2 and FIG. 3, the transmittance controlling element 20 may further include a substrate Sub1, a substrate Sub2, an alignment layer 26 and an alignment layer 28, wherein the substrate Sub1 may be disposed between the first polarizer PL1 and the first electrode layer E1, the substrate Sub2 may be disposed between the second polarizer PL2 and the second electrode layer E2, the alignment layer 26 is disposed between the liquid crystal layer LC and the first electrode layer E1, and the alignment layer 28 is disposed between the liquid crystal layer LC and the second electrode layer E2. The substrate Sub1 and the substrate Sub2 may be, for example, the same as or similar to the transparent substrate of the first substrate 12, but are not limited thereto. According to the alignment directions of the alignment layer 26 and the alignment layer 28 and the polarization directions of the first polarizer PL1 and the second polarizer PL2, the liquid crystal layer LC may have different transmittances while being driven by different voltage differences. It is noted that by means of controlling the transmittance of the transmittance controlling element 20, the transmittance of a part of the electronic device 1 corresponding to the light transmission opening T may be adjusted, thereby controlling brightness of the background light penetrating through the light transmitting opening T and the contrast of the images displayed by the display elements 18. In this way, the contrast of the images may be improved without increasing the brightness of light generated from the display elements 18, thereby reducing the energy consumption and/or improving comfort of the user while viewing the images. For example, when the electronic device 1 is applied to the vehicle windshield, the transmittance controlling element 20 may reduce the transmittance when the ambient light outside the vehicle is too bright, so as to improve the contrast of the displayed images without increasing the brightness of light generated from the display elements 18, and the transmittance controlling element 20 may increase the transmittance when the user wants to see the background image, thereby improving the comfort of the user. In some embodiments, depending on the types of the liquid crystal layer LC, the transmittance controlling element 20 may optionally not have the first polarizer PL1, the second polarizer PL2, the alignment layer 26, and the alignment layer 28.

As shown in FIG. 3, in some embodiments, the electronic device 1 may further optionally include a transparent filling layer 30 disposed in the light transmitting opening T, and the transparent filling layer 30 is disposed between the first substrate 12 and the second substrate 14. For example, the transparent filling layer 30 may fill the first opening 161b of the light blocking layer 161 and the second opening 24b of the partition wall 24, such that the probability that air exists between the first substrate 12 and the second substrate 14 may be reduced. With this arrangement, the light refraction/reflection path may be improved, thereby enhancing the reliability of the electronic device 1. The transparent filling layer 30 may, for example, include transparent resin or other suitable materials, but not limited thereto. In some embodiments, a refractive index of the transparent filling layer 30 may be adjusted to be close to or match with a refractive index of the transparent substrate of the first substrate 12 and a refractive index of the second substrate 14, so as to reduce the internal reflection between the first substrate 12 and the second substrate 14, thereby improving the transmittance of the light transmitting opening T. In some embodiments, the transparent filling layer 30 may include heterogeneous materials, so that its overall refractive index may be greater than the refractive index of the transparent substrate of the first substrate 12 and the refractive index of the second substrate 14. Accordingly, light may be easily scattered by the transparent filling layer 30, thereby reducing diffraction that occurs when the light penetrates through the light transmission opening T. For example, the transparent filling layer 30 may include scattering particles or other suitable particles.

The electronic device of the present disclosure is not limited to the above embodiment and may have different embodiments or varied embodiments. In order to simplify the description, the different embodiments and variant embodiments mentioned in the following content will use the same reference numerals as those of the first embodiment to mark the same elements. To compare the embodiments conveniently, the following description will detail the dissimilarities among different embodiments, and the identical features will not be redundantly described.

Figure 4:
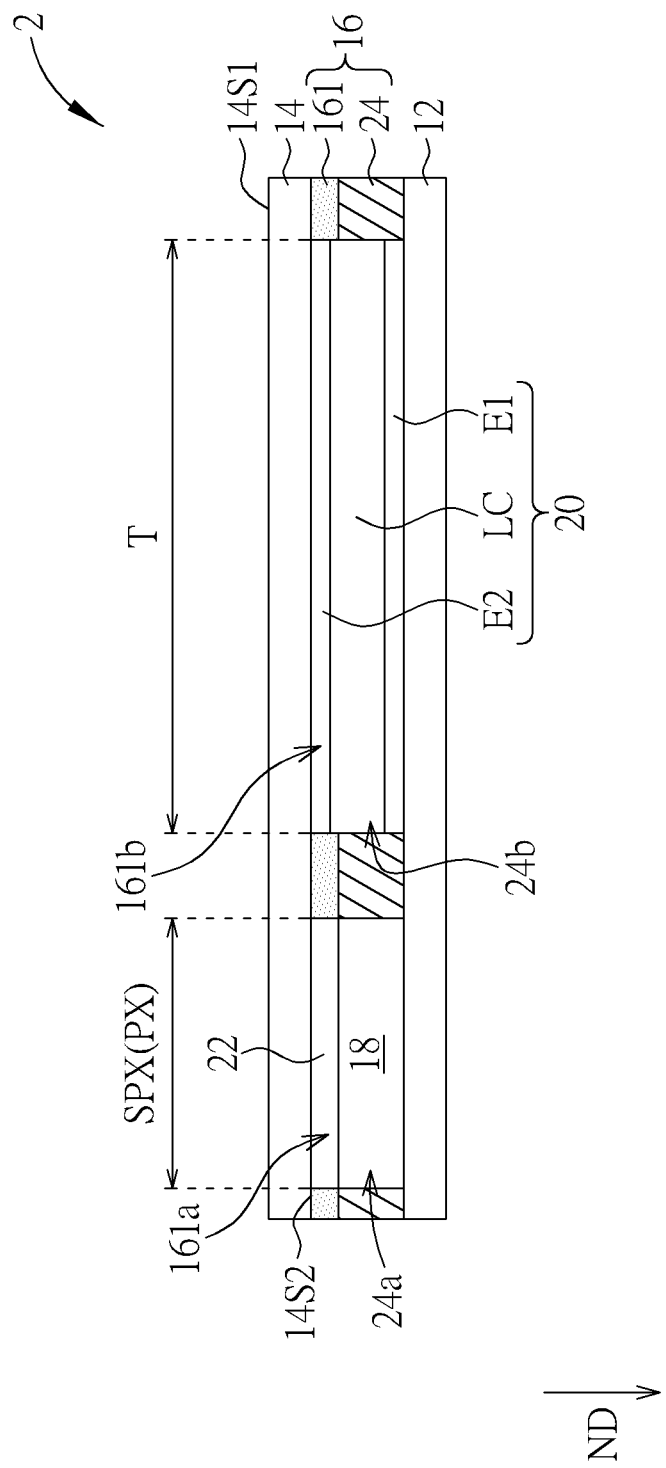
FIG. 4 schematically illustrates a cross-sectional view of an electronic device according to a second embodiment of the present disclosure.

FIG. 4 schematically illustrates a cross-sectional view of an electronic device according to a second embodiment of the present disclosure. As shown in FIG. 4, the electronic device 2 provided in the present embodiment differs from the electronic device 1 shown in FIG. 3 in that the transmittance controlling element 20 may be disposed between the first substrate 12 and the second substrate 14, in other words, the transmittance controlling element 20 may overlap the light transmitting opening T in the normal direction ND of the first substrate 12, or the light transmitting opening T exposes the transmittance controlling element 20. Specifically, the electronic device 2 may include a plurality of transmittance controlling elements 20, and each transmittance controlling element 20 may be disposed in one first opening 161b of the light blocking layer 161 and one second opening 24b of the partition wall 24 corresponding to the pixel region PX. In the embodiment of FIG. 4, one of the transmittance controlling elements 20 may include a first electrode layer E1, the second electrode layer E2, and the liquid crystal layer LC, in which the liquid crystal layer LC is disposed between the first electrode layer E1 and the second electrode layer E2, the first electrode layer E1 is disposed between the liquid crystal layer LC and the first substrate 12, and the second electrode layer E2 is disposed between the liquid crystal layer LC and the second substrate 14. The liquid crystal layer LC may for example include PDLC (polymer-dispersed liquid crystal) material, PNLC (polymer network liquid crystal) material, CLC (cholesteric liquid crystals) material or other suitable types of liquid crystal materials. For example, the transmittance controlling element 20 of the present embodiment may optionally not have the polarizers and other substrates (such as the polarizer PL1, the polarizer PL2, the substrate Sub1 and the substrate Sub2 shown in FIG. 2 and FIG. 3), or may further not have the alignment layers, but the present disclosure is not limited thereto. The transmittance of the transmittance controlling element 20 may be changed by adjusting the states of the liquid crystal layer LC, such that light entering the liquid crystal layer LC may be scattered, or light may be allowed to penetrate through the liquid crystal layer LC. In some embodiments, the liquid crystal layer LC may further optionally include a dye for adjusting the transmittance of the liquid crystal layer LC. For example, the liquid crystal layer LC may include CLC material and the dye, but is not limited thereto. In some embodiments, the contrast of the images of the electronic device 2 may be controlled by adjusting a thickness of the transmittance controlling element 20 in the normal direction ND of the first substrate 12.

In some embodiments, the transmittance controlling element 20 may further include a plurality of polarizing lines disposed between the first electrode layer E1 and the first substrate 12 and between the second electrode layer E2 and the second substrate 14, so as to polarize light before entering the liquid crystal layer LC and light after being emitted out of the liquid crystal layer LC.

Figure 5:
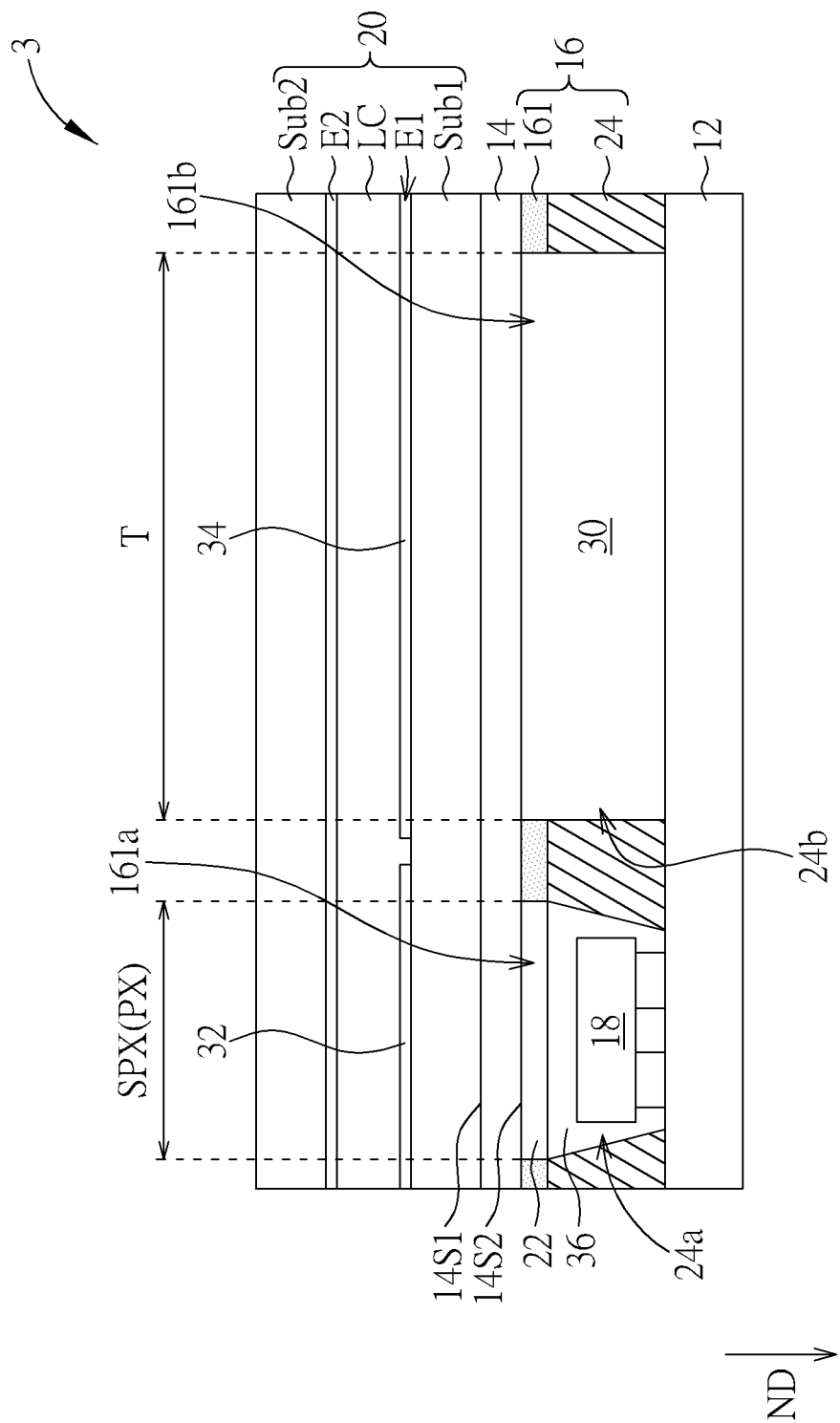
FIG. 5 schematically illustrates a cross-sectional view of an electronic device according to a third embodiment of the present disclosure.

FIG. 5 schematically illustrates a cross-sectional view of an electronic device according to a third embodiment of the present disclosure. As shown in FIG. 5, the electronic device 3 provided in the present embodiment differs from the electronic device 1 shown in FIG. 3 in that the transmittance controlling element 20 may be disposed on the upper surface 14S1 of the second substrate 14 away from the first substrate 12, in other words, the second substrate 14 may be disposed between the transmittance controlling element 20 and the first substrate 12. It should be noted that, the transmittance controlling element 20 may at least partially overlap the light transmitting opening T in the normal direction ND of the first substrate 12. In the embodiment of FIG. 5, the transmittance controlling element 20 may include the substrate Sub1, the substrate Sub2, the first electrode layer E1, the second electrode layer E2, in which the liquid crystal layer LC is disposed between the first electrode layer E1 and the second electrode layer E2, the first electrode layer E1 is disposed between the liquid crystal layer LC and the substrate Sub1, and the second electrode layer E2 is disposed between the liquid crystal layer LC and the substrate Sub2. In the present embodiment, the first electrode layer E1 may include an electrode 32 and an electrode 34 that are independently controlled, in which the electrode 32 is disposed in the sub-pixel region SPX, and the electrode 34 may overlap the light transmitting opening T. By means of providing independent voltages respectively to the electrode 32 and the electrode 34, orientations of the liquid crystal molecules of the liquid crystal layer LC corresponding to the sub-pixel region SPX and the light transmitting opening T may be respectively and independently controlled. Accordingly, the liquid crystal layer LC in the sub-pixel region SPX may serve as a collimating structure through the control to the electrode 32, so as to modulating viewing angle of the electronic device 3. For example, in a vehicle application, the driver may be prevented from seeing images from the electronic device 3 when the electronic device 3 is providing the images to a passenger, but the present disclosure is not limited thereto. The transmittance of apart of the liquid crystal layer LC corresponding to the light transmitting opening T may be adjusted through the control to the electrode 34. The liquid crystal layer LC of the present embodiment may for example include PDLC material, PNLC material, or other suitable types of liquid crystal materials. For example, the transmittance controlling element 20 of the present embodiment may optionally not have the polarizers, or may further not have the alignment layers, but the present disclosure is not limited thereto. The transmittance of the transmittance controlling element 20 may be changed by adjusting the states of the liquid crystal layer LC, such that light entering the liquid crystal layer LC may be scattered, or light may be allowed to penetrate through the liquid crystal layer LC. In some embodiments, the liquid crystal layer LC shown in FIG. 5 may be the same as or similar to the liquid crystal layer LC of FIG. 4, but not limited thereto.

As shown in FIG. 5, the electronic device 3 may further optionally include the transparent filling layer 30 disposed in the light transmitting opening T. Since the transparent filling layer 30 may be the same as or similar to the transparent filling layer 30 shown in FIG. 3 and will not be detailed redundantly.

In the embodiment shown in FIG. 5, one of the second display openings 24a corresponding to one of the display elements 18 and the first substrate 12 may form the light condensing structure for condensing light generated from the corresponding display element 18 and emitting the light toward the upper surface 14S1 that displays images, so as to enhancing light utilization rate of the corresponding display element 18. In detail, in the light condensing structure referred in the present disclosure, a width of at least one of the second display openings 24a in the first direction D1 may for example gradually increase along the normal direction ND of the first substrate 12, so that the second display opening 24a and the first substrate 12 may form a shape like a concave cup, thereby improving the light utilization rate of the display elements 18. The light condensing structure may for example be a shape of a concave cup or other suitable shapes according to product requirements. In some embodiments, the electronic device 3 may further include another transparent filling layer 36 disposed on the corresponding display element 18 and located in the corresponding second display opening 24a. The transparent filling layer 36 may for example include transparent resin or other suitable materials. In some embodiments, the transparent filling layer 36 may further include scattering particles, but not limited thereto.

FIG. 6 schematically illustrates a top view of an electronic device according to a fourth embodiment of the present disclosure. As shown in FIG. 6, the electronic device 4 provided in the present embodiment differs from the electronic device 1 shown in FIG. 1 in that the light transmitting opening T is not limited to be quadrilateral and may be other polygons, such as octagon. For example, an angle θ formed between two adjacent sides TS or extending lines TL of the two adjacent sides TS of the light transmitting opening T may be greater than 90 degrees. In some embodiments, in the light transmitting opening T, the number of the angles θ that are greater than 90 degrees may for example be greater than or equal to 4, but not limited thereto. In some embodiments, the electronic device 4 of FIG. 6 may further employ the transmittance controlling element 20 shown in FIG. 4 or FIG. 5.

Figure 7:
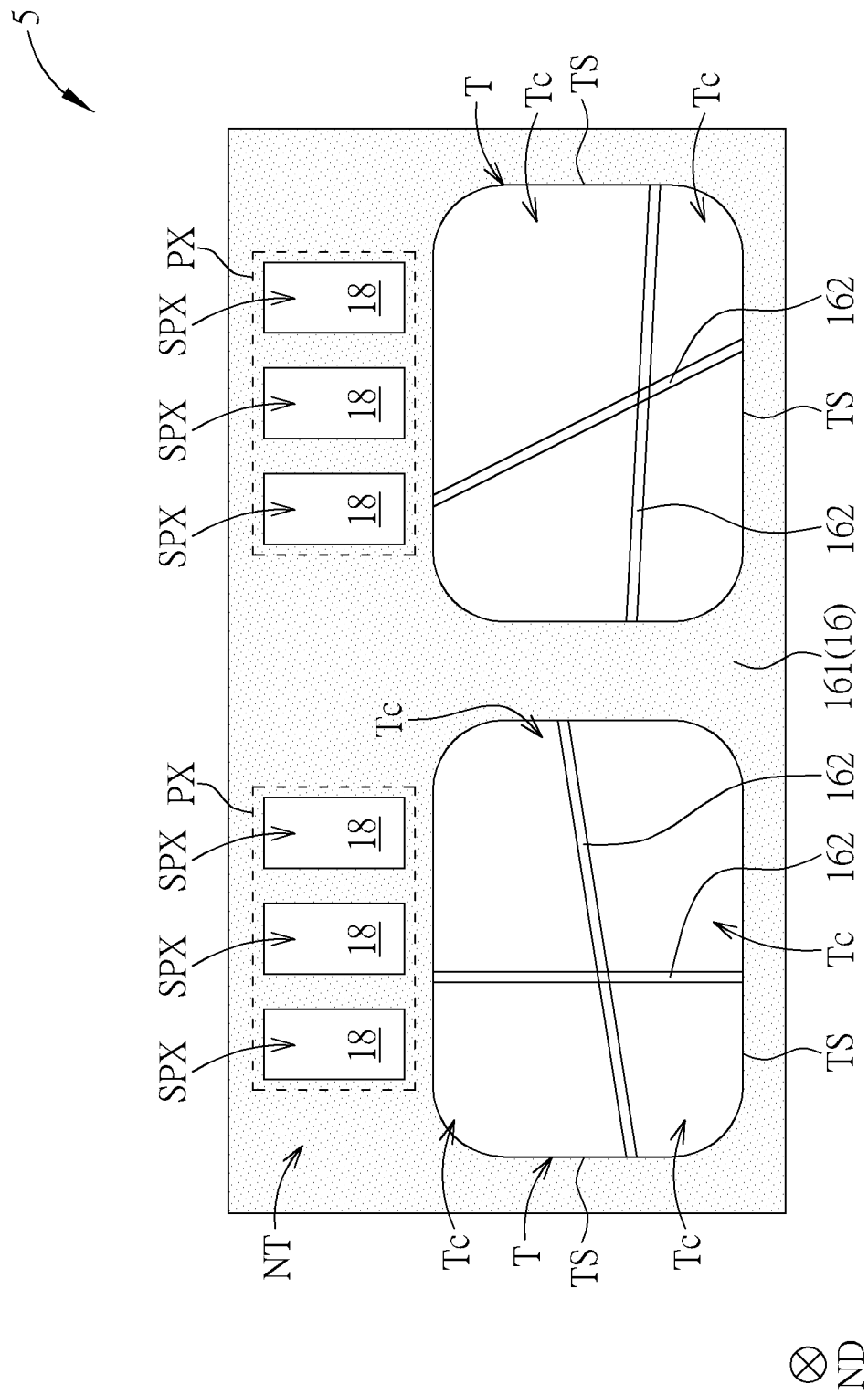
FIG. 7 schematically illustrates a top view of an electronic device according to a fifth embodiment of the present disclosure.

FIG. 7 schematically illustrates a top view of an electronic device according to a fifth embodiment of the present disclosure. As shown in FIG. 7, the electronic device 5 provided in the present embodiment differs from the electronic device 1 shown in FIG. 1 in that the light blocking element 16 may have at least two light transmitting sub-openings Tc. In the normal direction ND of the first substrate, the at least two light transmitting sub-openings Tc may overlap the transmittance controlling element 20 (e.g. the transmittance controlling element 20 shown in FIG. 3, FIG. 4 or FIG. 5). In the present embodiment, the at least two light transmitting sub-openings Tc may have different areas or shapes. In the normal direction ND of the first substrate, the light transmitting sub-openings Tc may allow light to penetrate through. Specifically, the electronic device 5 may include at least one light blocking line 162 and the light transmitting opening T that are overlapped with each other, that is to say, the light transmitting opening T overlaps at least one light blocking line 162 in the normal direction ND of the first substrate. Since the light blocking line 162 includes an opaque material, the light transmitting opening T overlapped by the at least one light blocking line 162 in the normal direction ND may form the at least two light transmitting sub-openings Tc that allow light to penetrate through it when the light blocking line 162 overlaps the light transmitting opening T in the normal direction ND of the first substrate. The light blocking line 162 may for example extend along the first direction D1 and cross the light transmitting opening T in the normal direction ND, so as to reduce the degree of the diffraction. For example, the extending direction of the light blocking line 162 may be different from the sides TS of the light transmitting opening T, so as to destroy constructive interference of light. Furthermore, by means of difference in shapes or areas of adjacent light transmitting sub-openings Tc, light penetrating through the adjacent light transmitting sub-openings Tc may create unconstructive interference (such as destructive interference), so as to reduce the degree of the diffraction. In some embodiments, the light transmitting sub-openings Tc may have different areas, but not limited thereto.

In the embodiment of FIG. 7, the electronic device 5 may have at least two adjacent light transmitting openings T. The light blocking element 16 may further have at least two light transmitting sub-openings Tc respectively in the two adjacent light transmitting openings T. In the present embodiment, the at least two light transmitting sub-openings Tc may have different areas or shapes, so as to reduce the degree of diffraction of light penetrating through the light transmitting openings T. In detail, numbers, shapes and dimensions of the light transmitting sub-openings Tc may be designed according to product requirements, but not limited thereto.

In the embodiment of FIG. 7, the light blocking line 162 and the light blocking layer 161 may be formed of different layers. For example, the light blocking line 162 may include a data line and/or a scan line located in the first substrate, the electrode in the transmittance controlling element 20, a combination of the foregoing, or other suitable opaque wires. The material of the light blocking line 162 may for example include metal or other opaque conductive materials. In some embodiments, the light blocking line 162 and the light blocking layer 161 may include the same material, may include the same layer formed by the same process, may be formed of the same layer, or may include the same layer sandwiched between two layers. In some embodiments, the extending directions of the light blocking lines 162 crossing adjacent two light transmitting openings T may be different, or positions of the light blocking lines 162 crossing the light transmitting openings T may be different. In some embodiments, areas or shapes of two light transmitting sub-openings Tc respectively located in adjacent two pixel regions PX may be different. In some embodiments, at least one corner of the light transmitting opening T shown in FIG. 7 may employ the round corner C of FIG. 1, and/or the light transmitting opening T shown in FIG. 7 may employ the polygon shown in FIG. 6. In some embodiments, the electronic device 5 of FIG. 7 may employ the transmittance controlling element 20 shown in FIG. 4 or FIG. 5.

Figure 8:
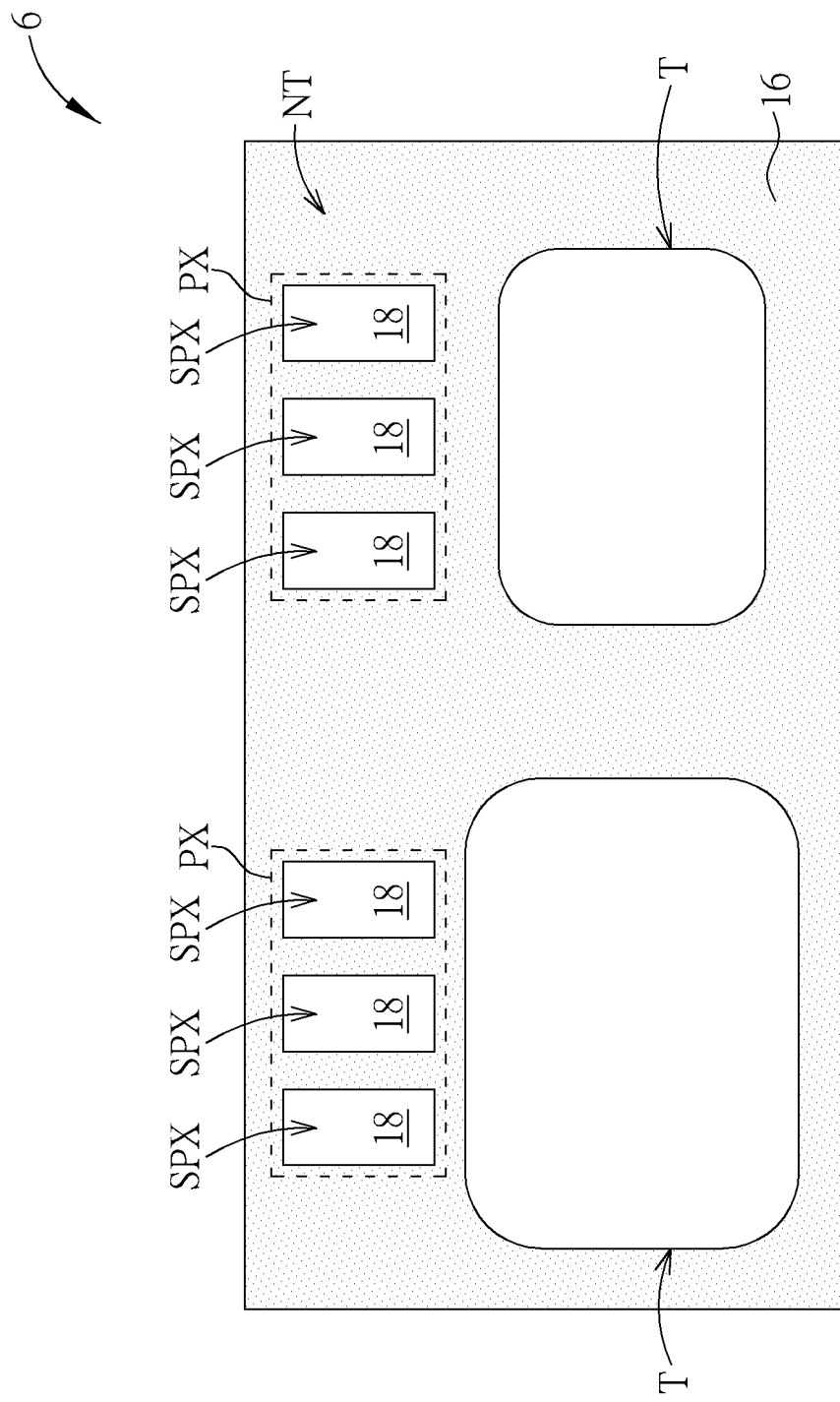
FIG. 8 schematically illustrates a top view of an electronic device according to a sixth embodiment of the present disclosure.

FIG. 8 schematically illustrates a top view of an electronic device according to a sixth embodiment of the present disclosure. As shown in FIG. 8, the electronic device 6 provided in the present embodiment differs from the electronic device 1 shown in FIG. 1 in that the electronic device 6 may have two adjacent light transmitting openings T. The two adjacent light transmitting openings T may have different areas, so as to reduce the degree of diffraction of light penetrating through the light transmitting openings T. In some embodiments, at least one of the light transmitting openings T shown in FIG. 8 may employ round corner of FIG. 1 and/or the polygon of FIG. 6. In some embodiments, the electronic device 6 shown in FIG. 8 may further include the light blocking line 162 shown in FIG. 7. In some embodiments, the electronic device 6 may employ the transmittance controlling element 20 shown in FIG. 4 or FIG. 5.

In the electronic device of the present disclosure, by means of controlling the transmittance of the transmittance controlling element, the transmittance of the electronic device in the light transmitting opening may be adjusted, so as to control brightness of light penetrating through the light transmitting opening and the contrast of images while displaying the images. In this way, the contrast of the images may be increased without enhancing brightness of light generated from the display elements, thereby reducing energy consumption and/or improving comfort to the user while viewing the images. Furthermore, the degree of diffraction of light penetrating through the light transmitting opening may be reduced by the round corner of the light transmitting opening, installation of the transmittance controlling element being capable of scattering light and corresponding to the light transmitting opening, and/or installation of the light blocking line in the light transmitting opening, thereby improving comfort of the user.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A transparent display device, comprising:
a first substrate and a second substrate, the second substrate being opposite to the first substrate;
a light blocking element disposed between the first substrate and the second substrate, the light blocking element having a light transmitting opening and a partition wall disposed between the first substrate and the second substrate, wherein the partition wall has a plurality of first display openings; and
a plurality of display elements, wherein at least one of the plurality of display elements is disposed in one of the plurality of first display openings;
wherein the light blocking element further has another light transmitting opening, and the another light transmitting opening and the light transmitting opening have different areas.

2. The transparent display device according to claim 1, wherein the light transmitting opening has at least two sides, and the at least two sides form a round corner.

3. The transparent display device according to claim 1, wherein the light blocking element comprises a light blocking layer disposed between the first substrate and the second substrate, and the light blocking layer has a first opening.

4. The transparent display device according to claim 3, wherein the partition wall disposed between the light blocking layer and the first substrate, the partition wall has a second opening corresponding to the first opening, and the first opening and the second opening define the light transmitting opening.

5. The transparent display device according to claim 4, wherein the light blocking layer has a plurality of second display openings, and the plurality of first display openings correspond to the plurality of second display openings respectively.

6. The transparent display device according to claim 5, further comprising a plurality of color filter layers respectively disposed in the plurality of second display openings.

7. The transparent display device according to claim 4, wherein a thickness of the partition wall in a normal direction of the first substrate is greater than a thickness of the light blocking layer in the normal direction of the first substrate.

8. The transparent display device according to claim 1, wherein the light transmitting opening has a major axis along a first direction and a minor axis along a second direction, a ratio of the major axis to the minor axis is greater than 1 and less than 1.5, and the first direction is different from the second direction.

9. The transparent display device according to claim 1, further comprising a transparent filling layer disposed in the light transmitting opening.

10. The transparent display device according to claim 1, further comprising a transmittance controlling element, wherein the light transmitting opening overlaps the transmittance controlling element in a normal direction of the first substrate.

11. The transparent display device according to claim 10, wherein the transmittance controlling element comprises a first electrode layer, a second electrode layer, and a liquid crystal layer.

* * * * *